United States Patent
Sharifi Tehrani

(10) Patent No.: US 11,699,498 B2
(45) Date of Patent: Jul. 11, 2023

(54) MANAGING PROBABILISTIC DATA INTEGRITY SCAN INTERVALS

(71) Applicant: Micron Technology, Inc., Boise, ID (US)

(72) Inventor: Saeed Sharifi Tehrani, San Diego, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 151 days.

(21) Appl. No.: 17/112,271

(22) Filed: Dec. 4, 2020

(65) Prior Publication Data
US 2022/0180955 A1 Jun. 9, 2022

(51) Int. Cl.
| | | |
|---|---|---|
| G06F 11/00 | (2006.01) | |
| G11C 29/10 | (2006.01) | |
| G06F 3/06 | (2006.01) | |
| G11C 16/26 | (2006.01) | |
| G11C 16/34 | (2006.01) | |
| G06F 11/20 | (2006.01) | |
| G06F 11/30 | (2006.01) | |
| G11C 16/04 | (2006.01) | |

(52) U.S. Cl.
CPC ............ *G11C 29/10* (2013.01); *G06F 3/0619* (2013.01); *G06F 3/0659* (2013.01); *G06F 3/0679* (2013.01); *G06F 11/2094* (2013.01); *G06F 11/3037* (2013.01); *G11C 16/26* (2013.01); *G11C 16/349* (2013.01); *G11C 16/0483* (2013.01)

(58) Field of Classification Search
CPC ............ G06F 11/2094; G06F 11/3037; G06F 3/0619; G11C 29/10; G11C 16/349
See application file for complete search history.

(56) References Cited

U.S. PATENT DOCUMENTS

| | | |
|---|---|---|
| 8,181,089 B1 | 5/2012 | Fernandes et al. |
| 8,291,295 B2 | 10/2012 | Harari et al. |
| 8,661,218 B1 | 2/2014 | Piszczek et al. |
| 9,053,808 B2 * | 6/2015 | Sprouse ................ G11B 20/18 |
| 10,950,292 B1 | 3/2021 | Seyedzadehdelcheh et al. |
| 2002/0145916 A1 | 10/2002 | Chevallier |
| 2006/0233020 A1 | 10/2006 | Ruby et al. |

(Continued)

OTHER PUBLICATIONS

Notice of Allowance, U.S. Appl. No. 17/112,347, dated Jun. 6, 2022, 23 pages.

(Continued)

*Primary Examiner* — Philip Guyton
(74) *Attorney, Agent, or Firm* — Nicholson De Vos Webster & Elliott LLP

(57) ABSTRACT

Exemplary methods, apparatuses, and systems include receiving read operations. The read operations are divided into a current set of a sequence of read operations and one or more other sets of sequences of read operations. An aggressor read operation is selected from the current set. A position in the sequence of read operations in the current set is determined such that the position that is preceded by at least a minimum number of read operations following a previous data integrity scan in a previous set of read operations. A data integrity scan is performed on a victim of the aggressor read operation at the determined position in the sequence of the current set of read operations.

20 Claims, 5 Drawing Sheets

(56) References Cited

U.S. PATENT DOCUMENTS

| | | |
|---|---|---|
| 2007/0159887 A1 | 7/2007 | Shih et al. |
| 2008/0256427 A1 | 10/2008 | He et al. |
| 2009/0073760 A1 | 3/2009 | Betser et al. |
| 2011/0066808 A1 | 3/2011 | Flynn et al. |
| 2011/0239089 A1 | 9/2011 | Haratsch et al. |
| 2013/0128666 A1 | 5/2013 | Avila et al. |
| 2013/0173989 A1 | 7/2013 | Chung et al. |
| 2013/0238955 A1 | 9/2013 | D'Abreu et al. |
| 2015/0161036 A1 | 6/2015 | Camp et al. |
| 2016/0124679 A1 | 5/2016 | Huang et al. |
| 2016/0188208 A1 | 6/2016 | Kim et al. |
| 2017/0287544 A1 | 10/2017 | Hedden |
| 2018/0039535 A1 | 2/2018 | Sharifi et al. |
| 2018/0190362 A1 | 7/2018 | Barndt et al. |
| 2019/0279735 A1 | 9/2019 | Zeng et al. |
| 2020/0066342 A1 | 2/2020 | Ha |
| 2020/0233739 A1 | 7/2020 | Oh |
| 2021/0034274 A1 | 2/2021 | Muchherla et al. |
| 2021/0089385 A1 | 3/2021 | Basuta et al. |
| 2021/0118519 A1 | 4/2021 | Muchherla et al. |
| 2022/0164113 A1 | 5/2022 | Hope et al. |
| 2022/0180955 A1* | 6/2022 | Sharifi Tehrani .... G11C 16/349 |

OTHER PUBLICATIONS

Notice of Allowance, U.S. Appl. No. 17/112,014, dated Apr. 7, 2022, 8 pages.

Non-Final Office Action, U.S. Appl. No. 17/112,428, dated Mar. 31, 2022, 8 pages.

Non-Final Office Action, U.S. Appl. No. 17/112,347, dated Feb. 18, 2022, 18 pages.

Notice of Allowance, U.S. Appl. No. 16/846,974, dated Feb. 16, 2022, 8 pages.

Requirement for Restriction/Election, U.S. Appl. No. 16/846,974, dated Sep. 28, 2021, 6 pages.

* cited by examiner

MANAGING PROBABILISTIC DATA INTEGRITY SCAN INTERVALS

TECHNICAL FIELD

The present disclosure generally relates to the mitigation of read disturb errors in a memory subsystem, and more specifically, relates to managing the data integrity scan intervals of a probabilistic data integrity scheme when mitigating read disturb errors.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
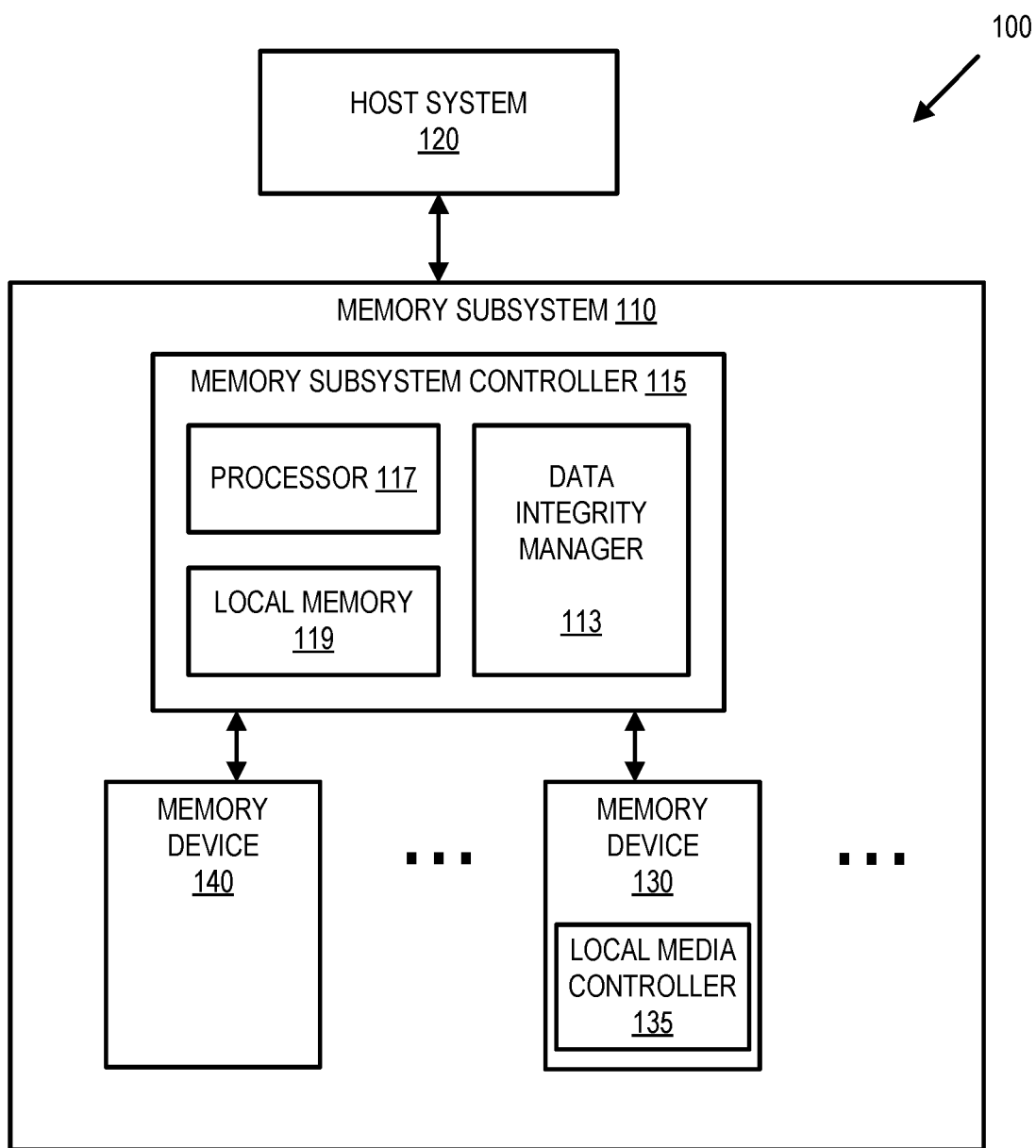
FIG. 1 illustrates an example computing system that includes a memory subsystem in accordance with some embodiments of the present disclosure.

Aspects of the present disclosure are directed to managing probabilistic data integrity scan intervals in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Data reliability in a memory can degrade as the memory device increases in density (e.g., device components scale down in size, when multiple bits are programmed per cell, etc.). One contributor to this reduction in reliability is read disturb. Read disturb occurs when a read operation performed on one portion of the memory (e.g., a row of cells), often referred to as the aggressor, impacts the threshold voltages in another portion of memory (e.g., a neighboring row of cells), often referred to as the victim. Memory devices typically have a finite tolerance for these disturbances. A sufficient amount of read disturb effects, such as a threshold number of read operations performed on neighboring aggressor cells, can change the victim cells in the other/unread portion of memory to different logical states than originally programmed, which results in errors.

A memory system can track read disturb by using counters per subdivision of memory and reprogramming a given subdivision of memory when the counter reaches a threshold value. A probabilistic data integrity scheme consumes less resources by counting or otherwise tracking sets of read operations in a portion of memory (e.g., a chip, logical unit, etc.) and performing a limited data integrity scan by checking the error rate of one or more read disturb victims of a randomly selected read operation in each set. These data integrity scans will occur with a frequency that, on average, will include scans occurring in intervals of N read operations, where N is equal to the number of read operations per set. Because the read operation that triggers a data integrity scan is random, however, a scan can occur between 1 and 2N read operations following a previous scan. Each data integrity scan can delay a host read operation. The occurrence of two data integrity scans in close proximity (e.g., back-to-back) can, therefore, impact the quality of service for the memory subsystem.

Aspects of the present disclosure address the above and other deficiencies by implementing a probabilistic data integrity scheme while managing the interval between data integrity scans. For example, some embodiments manage data integrity scans by restricting the scan interval to a minimum number or read operations between data integrity scans. As a result, the memory subsystem can implement a data integrity scheme that consumes less resources than one that maintains disturb counters while avoiding the host latency that results from performing two data integrity scans in close proximity.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a data integrity manager 113 that mitigates read disturb errors. In some embodiments, the controller 115 includes at least a portion of the data integrity manager 113. For example, the controller 115 can include a processor 117 (processing device) configured to execute instructions stored in local memory 119 for performing the operations described herein. In some embodiments, a data integrity manager 113 is part of the host system 120, an application, or an operating system.

The data integrity manager 113 can implement and manage a read disturb mitigation scheme. For example, the data integrity manager 113 can implement a probabilistic read disturb mitigation scheme and manage data integrity scans within that scheme by restricting the scan interval to a minimum number or read operations between data integrity scans. Further details with regards to the operations of the data integrity manager 113 are described below.

Figure 2:
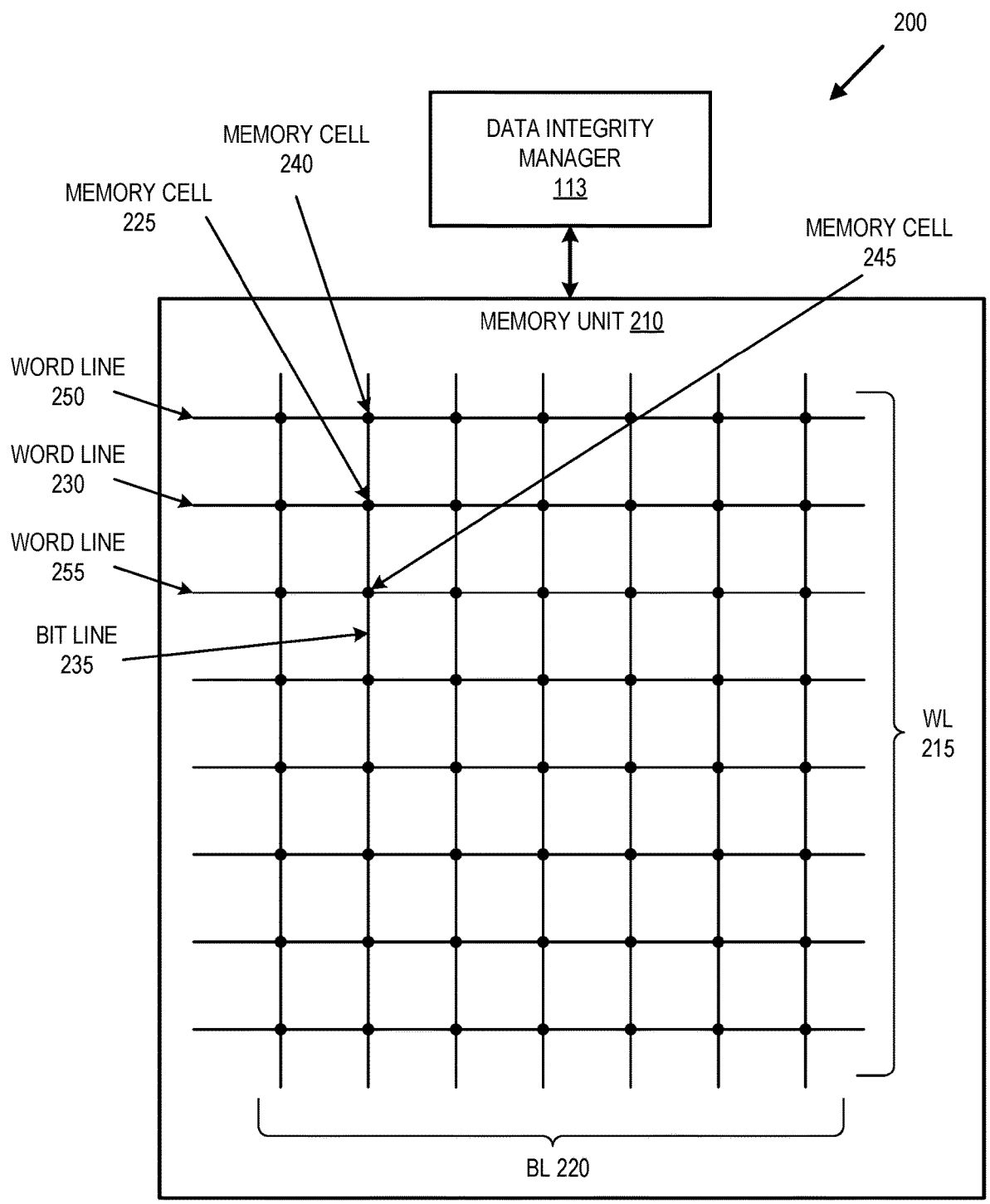
FIG. 2 illustrates an example of managing a portion of a memory subsystem in accordance with some embodiments of the present disclosure.

FIG. 2 illustrates an example of managing a portion of a memory subsystem 200 in accordance with some embodiments of the present disclosure. In one embodiment, the data integrity manager 113 implements a read disturb mitigation scheme per memory unit 210. For example, the data integrity manager 113 can perform a separate probabilistic read disturb mitigation scheme per LUN.

The illustration of the memory unit 210 includes an array of memory cells. The memory unit 210 illustrates a small number of memory cells for the sake of providing a simple explanation. Embodiments of the memory unit 210 can include far greater numbers of memory cells.

Each memory unit 210 includes memory cells that the memory subsystem 110 accesses via word lines 215 and bit lines 220. For example, a memory device 130 can read a page of memory using word line 230. Within that page, memory cell 225 is accessed via word line 230 and bit line 235. As described above, reading a memory cell can result in read disturb effects on other memory cells. For example, a read of memory cell 225 (the aggressor) can result disturbing memory cells 240 and 245 (the victims). Similarly, a read of other memory cells of word line 230 (the aggressor) can result in disturbing other memory cells of word lines 250 and 255 (the victims).

This disturb effect can increase the error rate for victim memory cells. In one embodiment, the data integrity manager 113 measures the error rate of a portion of memory as a raw bit error rate (RBER). The data integrity manager 113 can track and mitigate read disturb by tracking read operation traffic in the memory unit 210 and checking the error rate of victim(s). For example, the data integrity manager 113 can select a read operation directed to word line 230 as the aggressor for testing read disturb and perform a snap read of word lines 250 and 255 to determine the error rate of each. In response to detecting an error rate of a given victim portion of memory satisfying a threshold error rate value, the data integrity manager 113 can migrate data from the victim portion of memory to different portion of memory. This tracking and mitigation of read disturb is described further with reference to FIGS. 3 and 4.

Figure 3:
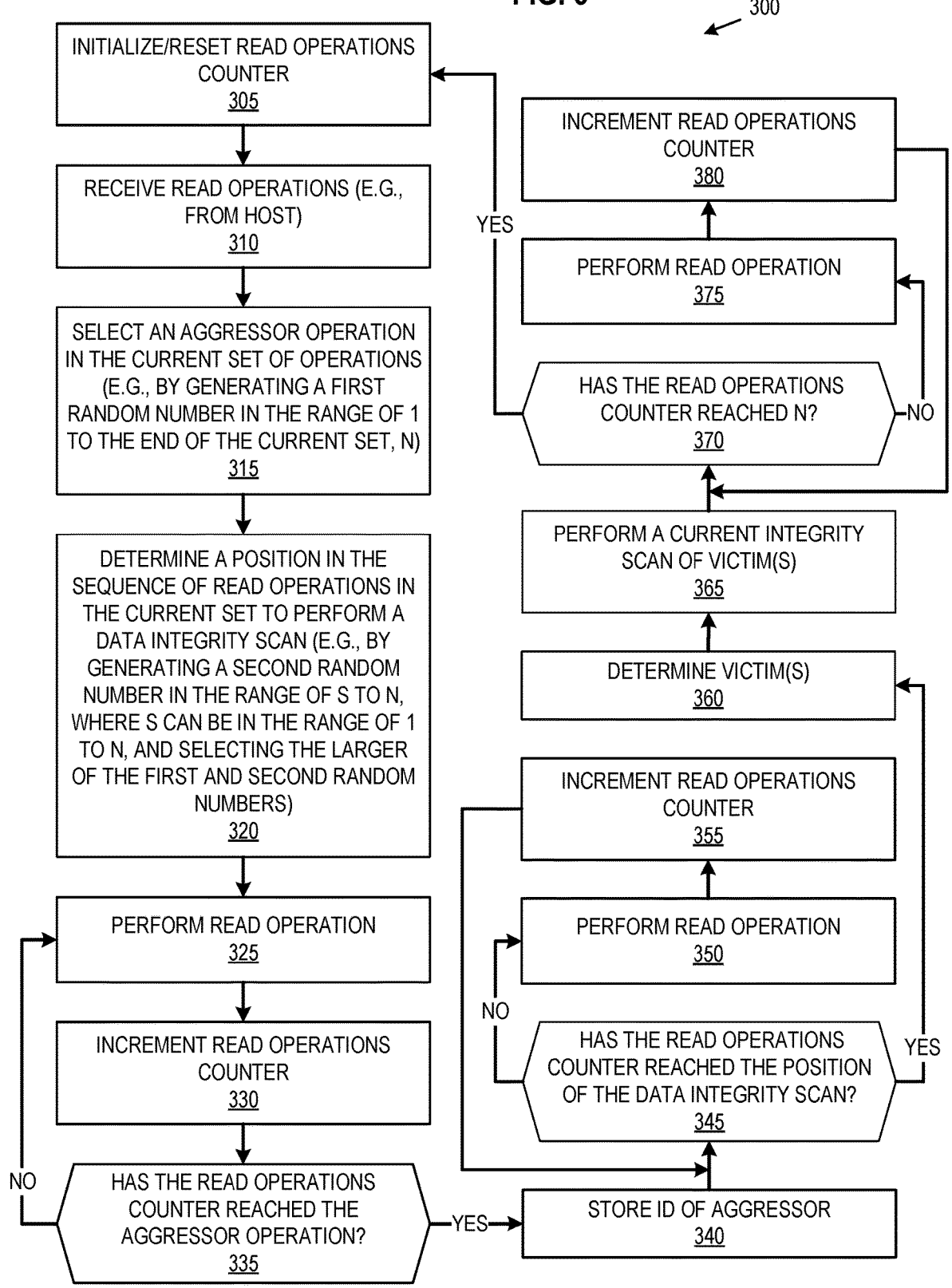
FIG. 3 is a flow diagram of an example method to manage probabilistic data integrity scan intervals in accordance with some embodiments of the present disclosure.

FIG. 3 is a flow diagram of an example method to manage probabilistic data integrity scan intervals in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device initializes or resets a counter for tracking the processing of read operations. For example, the processing device can set the counter to zero to begin tracking the processing of read operations in a set of read operations. In one embodiment, the processing device processes read operations in equally divided sets. For example, if each set includes 10,000 read operations, the counter is initialized or reset to a state that allows it to count at least 10,000 read operations. The number of operations per set can vary, however, and will referred to here as N.

At operation 310, the processing device receives read operation requests. Read requests can be received from one or more host systems and/or generated by another process within the memory subsystem 110. The processing device can receive read operation requests asynchronously, continuously, in batches, etc. In one embodiment, the memory subsystem 110 receives operation requests from one or more host systems 120 and stores those requests in a command queue. The processing device can process the read operations, from the command queue and/or as internally generated, in sets of N operations.

At operation 315, the processing device selects an aggressor operation in the current set of operations. When implementing a probabilistic read disturb handling scheme, the processing device can select an aggressor in the current set by generating a first random number (e.g., a uniform random number) in the range of 1 to N and, when the count of read operations reaches the first random number, identifying the current/last read operation as the aggressor.

At operation 320, the processing device determines a position in the sequence of read operations in the current set to perform a data integrity scan. The processing device selects a position in the sequence that is preceded by at least a minimum number of read operations following a previous data integrity scan. For example, when implementing a probabilistic read disturb handling scheme, the processing device can generate a second random number in the range of S to N, where S can be in the range of 1 to N. In selecting the position in the sequence of read operations, the processing device can use the first random number when the first random number is greater than or equal to the second random number. Otherwise, the processing device can use the second random number as the position in the sequence for a data integrity scan.

S can vary in value. The greater the value of S (the closer S is to N), the less deviation there will be from an interval of N read operations between data integrity scans. Less deviation results in more consistent/less varied intervals between scans. More deviation, on the other hand, can help reduce the likelihood of triggering scans in different memory units at the same time. In one embodiment, S is a dynamic value that is determined or otherwise set based upon one or more characteristics of the memory subsystem 110. Additionally, S can vary between portions of memory within the memory subsystem 110. For example, the value of S can be set based upon the value of N, the program-erase cycle, the operating queue depth, bit density of the memory (e.g., SLC, MLC, TLC, etc.), the program state of the memory (e.g., a partially programmed portion of memory vs. a fully programmed portion of memory), etc.

Data integrity, and the ability to read without errors, of a portion of memory diminishes with successive program-erase cycles (PEC). In one embodiment, the processing device uses different values of N based upon the number of PEC applied to the portion of memory (e.g., determined from a look-up table or another data structure). A lower value of N results in a higher scan frequency. As such, some embodiments decrease the value of N as the number of PEC increase. Similarly, the processing device can adjust a value of S based upon the PEC count or dynamic value of N. For example, the processing device can set the value S as a percentage of N, such as $0.8 \times N$. As N changes corresponding to the number of PEC, S changes as well. As another example, the processing device can set the value S as to different percentages of N based upon the number of PEC, such as $S=0.8 \times N$ in a first range of PEC and $S=0.5 \times N$ in another, higher range of PEC.

Data integrity, and the ability to read without errors, of a portion of memory can also vary based upon bit density. For example, a lower bit density portion of memory (e.g., SLC) can have a greater write endurance than a higher bit density portion of memory (e.g., QLC). In one embodiment, the processing device selects different values of N for different block types/bit densities. For example, the processing device can select a higher value of N for SLC blocks than for QLC blocks. Read workloads to different block types can be tracked separately for the mitigation of read disturb errors. Similar to adjusting N and/or S based upon PEC, the processing device can set values of S based upon different block types and/or different values of N.

The processing device can apply the above-described dynamic selection of values of S to the program state of portions of memory (a partially programmed portion of memory vs. a fully programmed portion of memory). For example, the processing device can use different percentages of N based upon the program state, such as $S=0.5 \times N$ for partially programmed portions of memory and $S=0.8 \times N$ for fully programmed portions of memory.

As previously described, a larger S value (i.e., closer to N) corresponds to more consistent, larger scan intervals but also a greater probability of scans in different memory units happening at the same time. This scan overlap is more likely if the queue depth is large and a host reads different memory units in parallel. In some embodiments, the processing device selects a smaller value of S (e.g., $S=0.5 \times N$) when the queue depth exceeds or otherwise satisfies a threshold value and/or the number of host reads served in parallel exceeds or otherwise satisfies a threshold value. As a result, the processing device lowers the possibility of scans of different memory units overlapping. Similarly, the processing device can select a higher value of S (e.g., $S=0.8 \times N$) when the queue depth does not exceed or otherwise satisfy a threshold value and/or the number of host reads served in parallel does not exceed or otherwise satisfy a threshold value.

At operation 325, the processing device performs a read operation. For example, the memory subsystem 110 read a page of data by accessing the memory cells along a word line and returning the data to the host system 120 or internal process that initiated the read request.

At operation 330, the processing device increments the read operations counter. For example, the processing device can increment the counter in response to completing a read operation to track the current position in the sequence of read operations in the current set.

At operation 335, the processing device determines if the read operations counter has reached the aggressor operation in the set. For example, the processing device can compare the value of the counter to the first random number generated to identify the aggressor read operation in the current set. If the counter has not yet reached the position in the sequence corresponding to the aggressor operation, the method 300 returns to operation 325 to continue the performance of the next read operation, as described above. If the counter has reached the position in the sequence corresponding to the aggressor operation, the method 300 proceeds to operation 340.

At operation 340, the processing device stores an identifier of the aggressor read operation. For example, the processing device can store a logical or physical address of the portion of memory subject to the aggressor read operation to allow for a subsequent lookup of one or more victim memory locations. In one embodiment, the memory subsystem 110 maintains a data structure mapping aggressor and victim relationships between memory locations. In an alternate embodiment, the processing device uses the identifier to lookup the victim(s) and stores the identifier(s) of the one or more victims rather than the aggressor.

At operation 345, the processing device determines if the read operations counter has reached the position of the data integrity scan. For example, the processing device can compare the value of the counter to the greater of the first random number and the second random number (or, either if the first and second random numbers are equal). If the read operations counter has not reached the position of the data integrity scan, the method 300 proceeds to operation 350. If the read operations counter has reached the position of the data integrity scan, the method 300 proceeds to operation 360.

At operations 350 and 355, the processing device performs a read operation and increments the read operations counter as described above with reference to operations 325 and 330. The method 300 proceeds to operation 345 to once again determine if the read operations counter has reached the position of the data integrity scan.

At operation 360, in response to reaching the position of the data integrity scan, the processing device determines the victim(s) of the aggressor read operation. As described above, the processing device can use a data structure or other mapping to look up the victim(s) based upon the stored identifier of the aggressor. Alternatively, when the identifier(s) of the victim(s) are stored at operation 340, the processing device can read the identifier(s) of the victim(s) rather than performing a lookup.

At operation 365, the processing device performs a current integrity scan of the victim(s). For example, the processing device can execute a read of each victim to check the error rate of the victim of the randomly-selected aggressor read operation.

In one embodiment, the processing device further determines if the error rate of each victim satisfies an error rate threshold. For example, the error rate threshold can equate to a number of bits in error for a given read operation. If the error rate of a victim satisfies the error rate threshold, the processing device migrates the data from the victim to a different location in memory to mitigate the impact of read disturb on the victim memory location.

At operation 370, the processing device determines if the read operations counter has reached the end of the current set. For example, the processing device can compare the value of the counter to the value of N. If the read operations counter has reached the end of the current set, the method 300 proceeds to operation 305 to reset the counter and process the next set of read operations. If the read operations counter has not reached the end of the current set, the method 300 proceeds to operation 375.

At operations 375 and 380, the processing device performs a read operation and increments the read operations counter as described above with reference to operations 325 and 330. The method 300 proceeds to operation 370 to once again determine if the read operations counter has reached the end of the current set.

Figure 4:
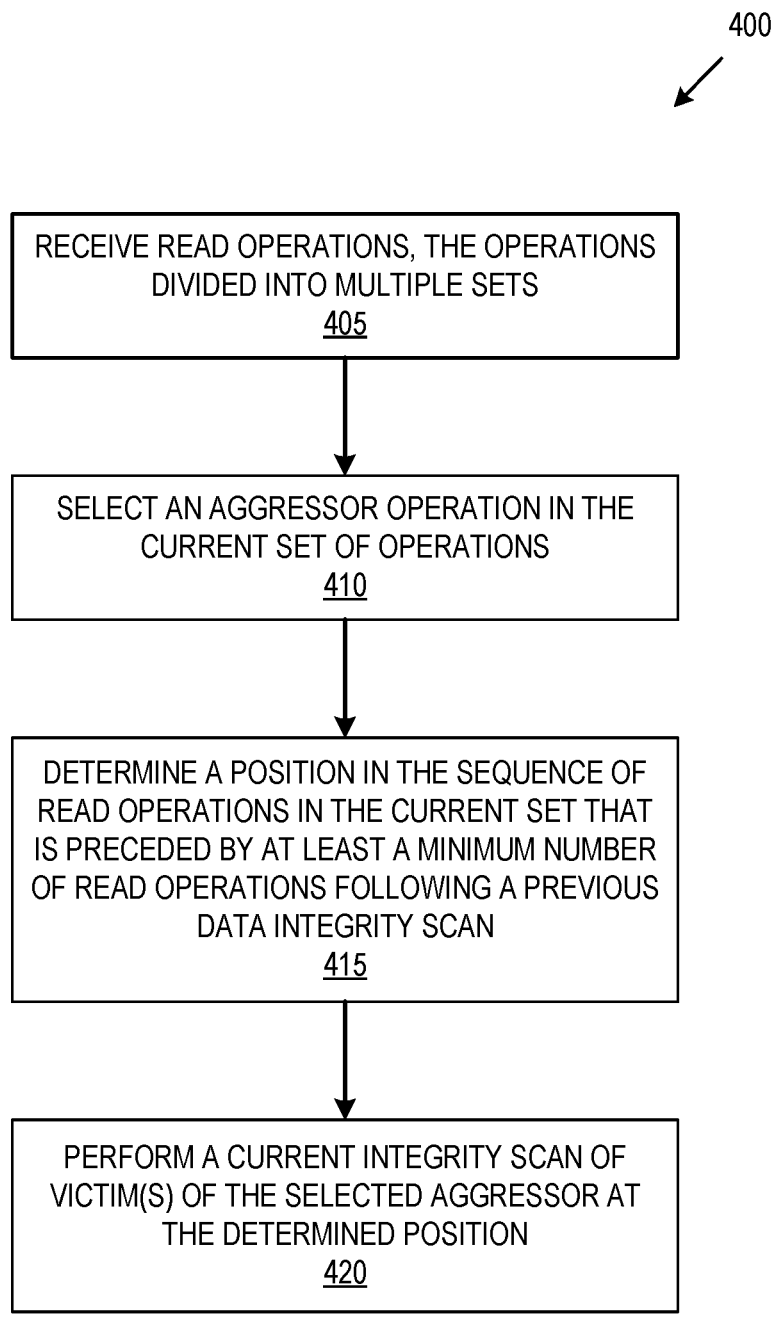
FIG. 4 is flow diagram of another example method to manage probabilistic data integrity scan intervals in accordance with some embodiments of the present disclosure.

FIG. 4 is a flow diagram of another example method 400 to manage probabilistic data integrity scan intervals in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives read operations, e.g., as described with reference to operation 305. The processing device divides the read operations into sets of read operations. For example, the processing device can use a counter to track a number, N, of operations to be performed per set.

At operation 410, the processing device selects an aggressor read operation in the current set of operations. For example, the processing device can randomly select a read operation in the current set to identify one or more victims to be the subject of a data integrity scan.

At operation 415, the processing device determines a position in the sequence of the current read operations set that is preceded by at least a minimum number of read operations following the previous data integrity scan. For example, the processing device can restrict the position in the sequence by selecting a second random number in the range of S to N as described with reference to operation 320 and selecting the larger value between the first and second randomly-generated positions.

At operation 420, in response to reaching the position determined in operation 415, the processing device performs the data integrity scan of the victim(s) of the aggressor read operation, e.g., as described with reference to operation 365.

Figure 5:
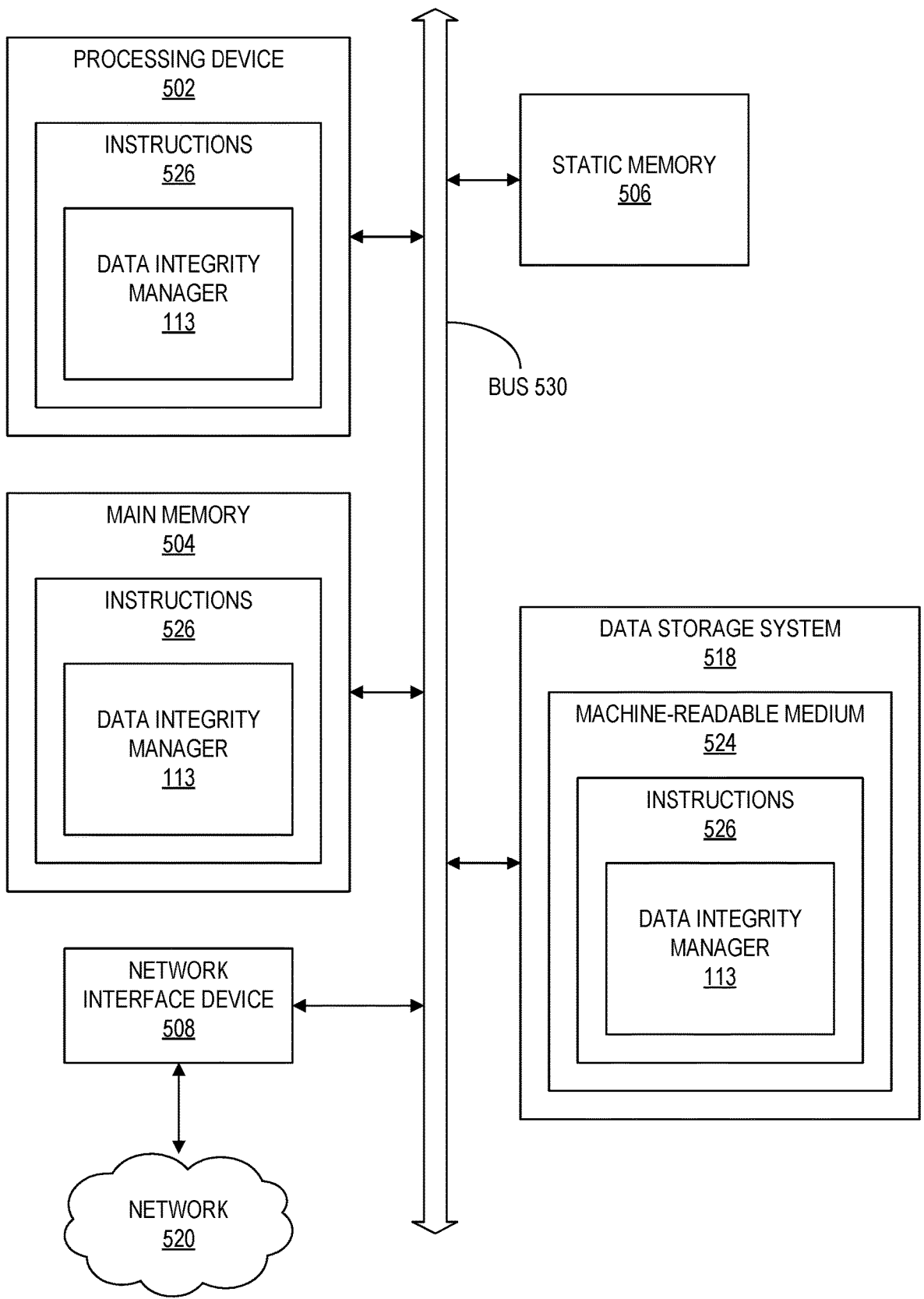
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the data integrity manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a data integrity manager (e.g., the data integrity manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a plurality of read operations, the plurality of read operations divided into a current set of a sequence of read operations and one or more other sets of sequences of read operations;
   selecting an aggressor read operation from the current set;

storing an identifier of the aggressor upon reaching the aggressor read operation in the sequence of read operations in the current set;

determining a position in the sequence of read operations in the current set that is preceded by at least a minimum number of read operations following a previous data integrity scan in a previous set of read operations; and using the stored identifier to perform a current data integrity scan on a victim of the aggressor read operation at the determined position in the sequence.

2. The method of claim 1, wherein the determined position differs from a position in the sequence preceding or following the aggressor read operation.

3. The method of claim 1, wherein each set includes N read operations, the method further comprising:

generating a first random number that is less than or equal to N, wherein selecting the aggressor read operation includes selecting the read operation that is in the position in the current set indicated by the first random number.

4. The method of claim 3, further comprising:

generating a second random number that is greater than or equal to a range parameter S and that is less than or equal to N, wherein S has a value in the range of 1 to N, wherein the current data integrity scan is performed upon reaching a read operation in the sequence that corresponds to the second random number.

5. The method of claim 4, wherein the value of S is dynamically set based upon one or more of:

a program-erase cycle of a portion of memory, an operating queue depth, bit density of the portion of memory, and/or a program state of the portion of memory.

6. The method of claim 1, further comprising:

migrating data from the victim to a different memory location in response to the current data integrity scan indicating that the victim satisfies an error threshold.

7. The method of claim 1, further comprising:

incrementing a read operation counter in response to performing a read operation; and resetting the read operation counter after performing the sequence of read operations of the current set.

8. A non-transitory computer-readable storage medium comprising instructions that, when executed by a processing device, cause the processing device to:

receive a plurality of read operations, the plurality of read operations divided into a current set of a sequence of read operations and one or more other sets of sequences of read operations;

select an aggressor read operation from the current set;

store an identifier of the aggressor upon reaching the aggressor read operation in the sequence of read operations in the current set;

determine a position in the sequence of read operations in the current set that is preceded by at least a minimum number of read operations following a previous data integrity scan in a previous set of read operations; and use the stored identifier to perform a current data integrity scan on a victim of the aggressor read operation at the determined position in the sequence.

9. The non-transitory computer-readable storage medium of claim 8, wherein the determined position differs from a position in the sequence preceding or following the aggressor read operation.

10. The non-transitory computer-readable storage medium of claim 8, wherein each set includes N read operations, and wherein the processing device is further to:

generate a first random number that is less than or equal to N, wherein selecting the aggressor read operation includes selecting the read operation that is in the position in the current set indicated by the first random number.

11. The non-transitory computer-readable storage medium of claim 10, wherein the processing device is further to:

generate a second random number that is greater than or equal to a range parameter S and that is less than or equal to N, wherein S has a value in the range of 1 to N, wherein the current data integrity scan is performed upon reaching a read operation in the sequence that corresponds to the second random number.

12. The non-transitory computer-readable storage medium of claim 11, wherein the value of S is dynamically set based upon one or more of:

a program-erase cycle of a portion of memory, an operating queue depth, bit density of the portion of memory, and/or a program state of the portion of memory.

13. The non-transitory computer-readable storage medium of claim 8, wherein the processing device is further to:

migrate data from the victim to a different memory location in response to the current data integrity scan indicating that the victim satisfies an error threshold.

14. The non-transitory computer-readable storage medium of claim 8, wherein the processing device is further to:

increment a read operation counter in response to performing a read operation; and reset the read operation counter after performing the sequence of read operations of the current set.

15. A system comprising:

a plurality of memory devices; and a processing device, operatively coupled with the plurality of memory devices, to:

receive a plurality of read operations, the plurality of read operations divided into a current set of a sequence of read operations and one or more other sets of sequences of read operations;

select an aggressor read operation from the current set;

determine a position in the sequence of read operations in the current set that is preceded by at least a minimum number of read operations following a previous data integrity scan in a previous set of read operations;

perform a current data integrity scan on a victim of the aggressor read operation at the determined position in the sequence;

store an identifier of the aggressor upon reaching the aggressor read operation in the sequence of read operations in the current set; and use the stored identifier to perform the current data integrity scan at the determined position in the sequence of read operations in the current set, the determined position differing from a position in the sequence preceding or following the aggressor read operation.

16. The system of claim 15, wherein each set includes N read operations, and wherein the processing device is further to:

generate a first random number that is less than or equal to N, wherein selecting the aggressor read operation includes selecting the read operation that is in the position in the current set indicated by the first random number.

17. The system of claim 16, wherein the processing device is further to:
generate a second random number that is greater than or equal to a range parameter S and that is less than or equal to N, wherein S has a value in the range of 1 to N, wherein the current data integrity scan is performed upon reaching a read operation in the sequence that corresponds to the second random number.

18. The system of claim 17, wherein the value of S is dynamically set based upon one or more of:
a program-erase cycle of a portion of memory, an operating queue depth, bit density of the portion of memory, and/or a program state of the portion of memory.

19. The system of claim 15, wherein the processing device is further to:
migrate data from the victim to a different memory location in response to the current data integrity scan indicating that the victim satisfies an error threshold.

20. The system of claim 15, wherein the processing device is further to:
increment a read operation counter in response to performing a read operation; and
reset the read operation counter after performing the sequence of read operations of the current set.

* * * * *